US011677339B2

(12) United States Patent
Pan et al.

(10) Patent No.: US 11,677,339 B2
(45) Date of Patent: Jun. 13, 2023

(54) START-UP INITIALIZATION CIRCUIT OF MOTOR DRIVE SYSTEM

(71) Applicant: Hefei Aichuangwei Electronic Technology Co., Ltd., Hefei (CN)

(72) Inventors: Jun Pan, Hefei (CN); Lixiang Xu, Hefei (CN); Lixiang Wen, Hefei (CN); Lei Qiu, Hefei (CN); Dianwu Li, Hefei (CN); Wei Wang, Hefei (CN); Lei Han, Hefei (CN); Ke Wang, Hefei (CN)

(73) Assignee: Hefei Aichuangwei Electronic Technology Co., Ltd., Hefei (CN)

( * ) Notice: Subject to any disclaimer, the term of this patent is extended or adjusted under 35 U.S.C. 154(b) by 0 days.

(21) Appl. No.: 17/551,852

(22) Filed: Dec. 15, 2021

(65) Prior Publication Data

US 2023/0126463 A1 Apr. 27, 2023

(30) Foreign Application Priority Data

Oct. 22, 2021 (CN) .......................... 202111234435.9

(51) Int. Cl.
*H02P 1/02* (2006.01)
(52) U.S. Cl.
CPC .................................... *H02P 1/026* (2013.01)
(58) Field of Classification Search
CPC ...................................................... H02P 1/026
See application file for complete search history.

(56) References Cited

U.S. PATENT DOCUMENTS

| 4,541,029 | A | * | 9/1985 | Ohyama | ................ | H02H 7/093 |
| | | | | | | 361/87 |
| 2010/0327796 | A1 | * | 12/2010 | Koshobu | ................ | G05B 19/19 |
| | | | | | | 318/625 |
| 2015/0166332 | A1 | * | 6/2015 | Billiot | .................. | H03L 7/0816 |
| | | | | | | 318/116 |
| 2015/0311828 | A1 | * | 10/2015 | Durand | ..................... | H02P 1/28 |
| | | | | | | 318/778 |

* cited by examiner

*Primary Examiner* — Kawing Chan
(74) *Attorney, Agent, or Firm* — Kirk A. Wilson; Joseph T. Guy; Patent Filing Specialist Inc.

(57) ABSTRACT

The present disclosure provides a start-up initialization circuit of motor drive system, including a power amplitude detecting and internal power supply module, a controlled delay module, a waveform shaping module and a power supply judging and adjusting module integrated on a same substrate, configured to detect and manage a voltage change of each node of a drive system in real time to cause a motor drive system to realize a start-up initialization process transit from an off state to a normal working state. The present disclosure finally forms the start-up initialization circuit of motor drive system by integrating the power amplitude detecting and internal power supply module, the controlled delay module, the waveform shaping module and the power supply judging and adjusting module and integrating on a single chip, which greatly ensures the reliability of power on and start-up of the motor drive system.

5 Claims, 2 Drawing Sheets

START-UP INITIALIZATION CIRCUIT OF MOTOR DRIVE SYSTEM

CROSS REFERENCE TO RELATED APPLICATION(S)

This patent application claims the benefit and priority of Chinese Patent Application No. 202111234435.9, filed on Oct. 22, 2021 the disclosure of which is incorporated by reference herein in its entirety as part of the present application.

TECHNICAL FIELD

The present disclosure relates to a technical field of semiconductor integrated circuit design, in particular to a start-up initialization circuit of motor drive system.

BACKGROUND ART

Under the prior art, in an actual application process of various drive systems, due to there must be a transition process started from scratch on normal working voltage parameters, in order to ensure the stability and reliability of the drive system, the voltage change of each node of the drive system must be detected and managed in real time, especially in a field of motor drive system design, each key voltage node of the system must be powered on and started in real time, and controlled according to detection data.

SUMMARY

The object of the present disclosure is to provide a start-up initialization circuit of a motor drive system to solve the problems proposed in the above background technology.

In order to achieve the above purpose, the present disclosure adopts the following technical scheme:

A start-up initialization circuit of motor drive system includes a power amplitude detecting and internal power supply module, a controlled delay module, a waveform shaping module and a power supply judging and adjusting module integrated on a same substrate, configured to detect and manage a voltage change of each node of a drive system in real time to cause a motor drive system to realize a start-up initialization process transit from an off state to a normal working state.

Further, a power supply positive end of the power amplitude detecting and internal power supply module is connected to an external power supply to output a VCC voltage and a VA voltage; a positive power supply end of the controlled delay module is connected to a VCC voltage output end, and an input end of the controlled delay module is connected to a VA voltage output end to output a VB voltage; a positive power supply end of the waveform shaping module is connected to the VCC voltage output end, and an input end of the waveform shaping module is connected to the VB voltage output end to output a VC voltage; a power supply positive end of the power supply judging and adjusting module is connected to the VCC voltage output end, and an input end of the power supply judging and adjusting module is connected to the VC voltage output end to output the VB voltage; negative power supply ends of the power amplitude detecting and internal power supply module, the controlled delay module, the waveform shaping module and the power supply judging and adjusting module are grounded.

Further, the power amplitude detecting and internal power supply module includes resistors R1, R2, R3 and a zener diode D1, one end of the resistors R1 and R3 is connected to the external power supply, wherein the other end of the resistor R1 is used as the VA voltage output end and connected to one end of the resistor R2, and the other end of the resistor R3 is used as the VCC voltage output end and connected to a negative pole of the zener diode D1, the other end of the resistor R2 is connected to a positive pole of the zener diode D1 and grounded.

Further, the controlled delay module includes a resistor R4 and MOS tubes M1, M2, M3 and M4, a source of the MOS tube M1 is connected to the VCC voltage output end, and gates of the MOS tubes M1 and M2 are interconnected and connected to the VA voltage output end, and drains of the MOS tube M1 and M2 are interconnected to a gate of the MOS tube M3; a drain of the MOS tube M3 is used as the VB voltage output end and connected to one end of the resistor R4 and a gate of the MOS tube M4, the other end of the resistor R4 is connected to the VA voltage output end, and a drain of the MOS tube M4 is connected to a source of the MOS tube M4 and the sources of the MOS tubes M1 and M2, and grounded.

Further, the waveform shaping module includes MOS tubes M5, M6, M7 and M8, gates of the MOS tubes M5 and M6 are interconnected and connected to the VB voltage output end, sources of the MOS tubes M5 and M7 are interconnected and connected to the VCC voltage output end, drains of the MOS tubes M5 and M6 are interconnected and connected to gates of the MOS tubes M7 and M8, the gates of the MOS tubes M7 and M8 are interconnected and drains of the MOS tubes M7 and M8 are interconnected to use as the VC voltage output end, and the sources of the MOS tubes M6 and M7 are interconnected and grounded.

Further, the power supply judging and adjusting module includes resistors R5 and R6, a unidirectional diode D2 and MOS tubes M9, M10 and M11, one end of the resistor R5 and the unidirectional diode D2 is connected to the VC voltage output end, the other end of the unidirectional diode D2 is connected to a source of the MOS tube M9, and a gate of the MOS tube M9 is connected to the VC voltage output end, a drain of the MOS tube M9 is respectively connected to one end of resistor R6 and a gate of the MOS tube M10, drains of the MOS tubes M10 and M11 are interconnected and connected to the other end of the resistor R5, the other end of the resistor R6 is connected to sources of the MOS tubes M10 and M11 and grounded.

It can be seen from the above technical scheme that the present disclosure finally forms the start-up initialization circuit of motor drive system by integrating the power amplitude detecting and internal power supply module, the controlled delay module, the waveform shaping module and the power supply judging and adjusting module and integrating on a single chip, which greatly ensures the reliability of power on and start-up of the motor drive system, and provides a guarantee for the smooth and efficient operation of the motor drive system.

In figure: 1. power amplitude detecting and internal power supply module; 2. controlled delay module; 3. waveform shaping module; 4. power supply judging and adjusting module.

DETAILED DESCRIPTION OF THE EMBODIMENTS

A preferred implementation of the present disclosure is described in detail below in conjunction with the appended drawings.

Figure 1:
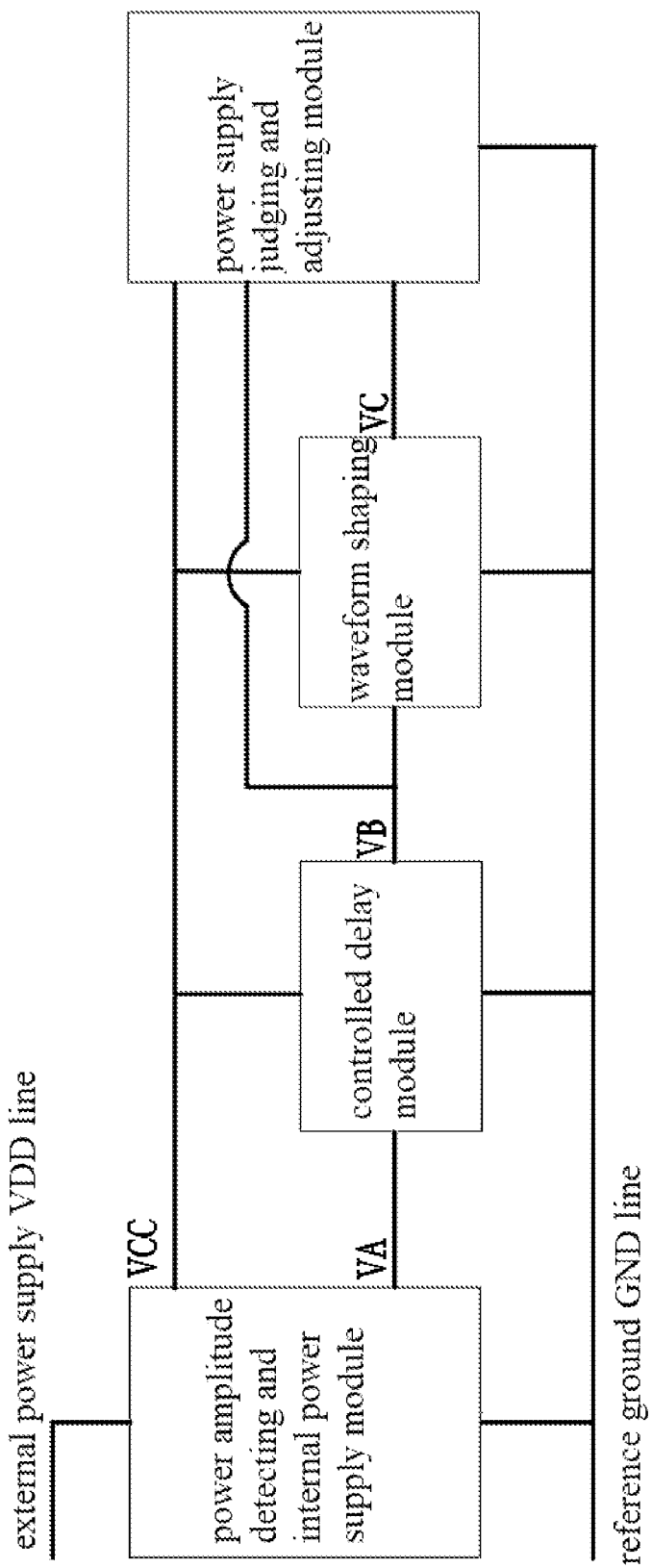
FIG. 1 is a block connection diagram of the present disclosure.

A start-up initialization circuit of a motor drive system shown in FIG. 1 includes a power amplitude detecting and internal power supply module, a controlled delay module, a waveform shaping module and a power supply judging and adjusting module integrated on a same baseboard. Specifically, a positive power supply end of the power amplitude detecting and internal power supply module is connected to an external power supply to output a VCC voltage and a VA voltage. A positive power supply end of the controlled delay module is connected to a VCC voltage output end, and an input end of the controlled delay module is connected to the VA voltage output end to output a VB voltage. A positive power supply end of the waveform shaping module is connected to the VCC voltage output end, and an input end of the waveform shaping module is connected to a VB voltage output end to output a VC voltage. A positive power supply end of the power supply judging and adjusting module is connected to the VCC voltage output end, and an input end of the power supply judging and adjusting module is connected to the VC voltage output end to output the VB voltage. Negative power supply ends of the above modules are grounded. In the figure, an external power supply VDD line and a reference ground GND line are used to characterize the application details of the circuit.

Figure 2:
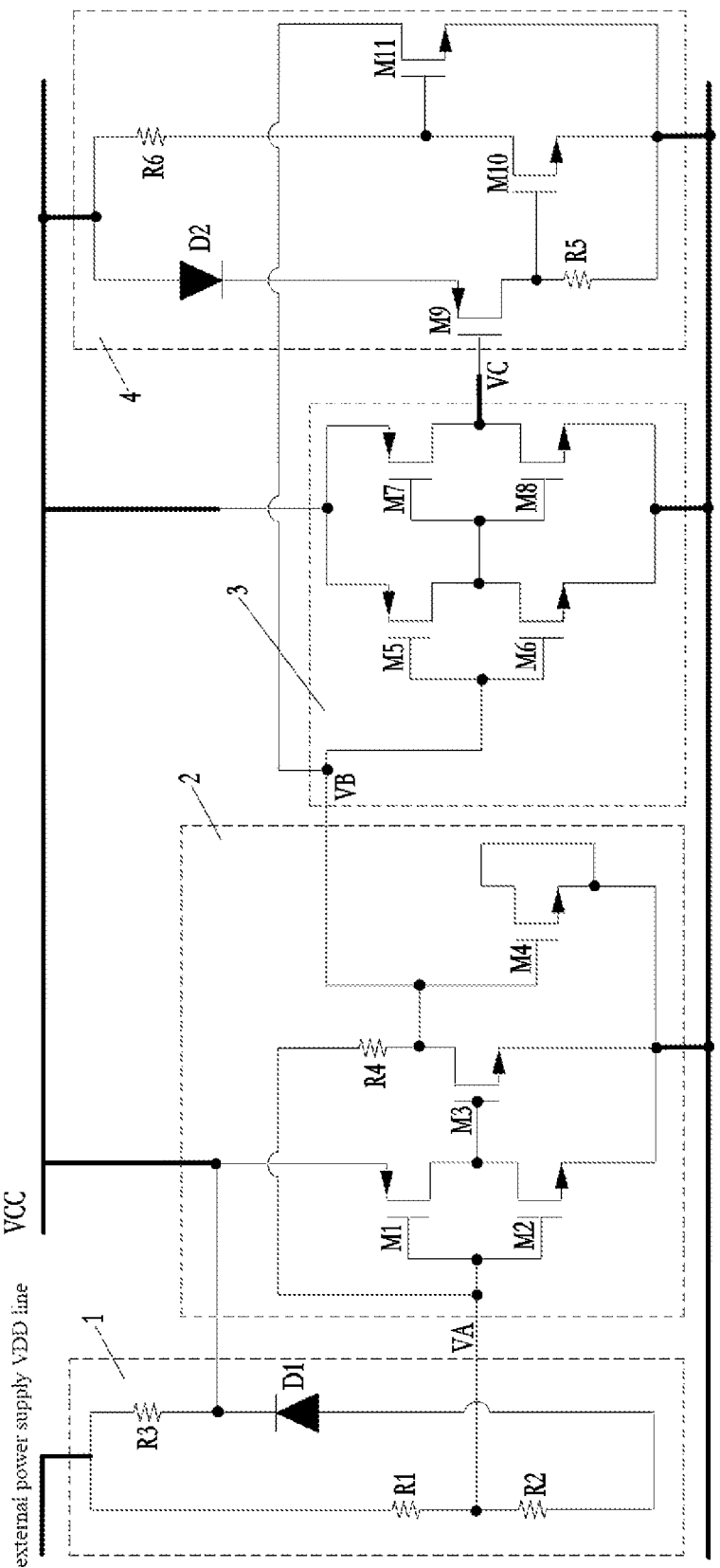
FIG. 2 is a circuit connection diagram of the present disclosure.

Specifically, as shown in FIG. 2:

The power amplitude detecting and internal power supply module described in the preferred embodiment includes resistors R1, R2, R3 and a zener diode D1. One end of the resistors R1 and R3 is connected to the external power supply VDD line, wherein the other end of the resistor R1 is used as the VA voltage output end and connected to one end of the resistor R2, and the other end of the resistor R3 is used as the VCC voltage output end and connected to a negative pole of the zener diode D1, the other end of the resistor R2 is connected to a positive pole of the zener diode D1 and connected to the reference ground GND line. The power amplitude detecting and internal power supply module enables the zener diode D1 to have stable bias conditions through the internal resistance R3, which is specifically reflected in the constant voltage difference between the two ends of the zener diode D1. In this way, the external power supply of the motor drive system is automatically used to construct the internal power supply and converted into the voltage VCC output by one of the output ends of the power amplitude detecting and internal power supply module, and the voltage VCC value is the above constant voltage difference. The power amplitude detecting and internal power supply module realizes the real-time detection of the voltage amplitude of the external power supply of the motor drive system through the series voltage division of the internal resistance R1 and resistance R2, and converts it into the voltage VA output at the other output end of the power amplitude detecting and internal power supply module for use by subsequent modules.

The controlled delay module described in the preferred embodiment includes a resistor R4 and MOS tubes M1, M2, M3 and M4. A source of the MOS tube M1 is connected to the VCC voltage output end, gates of the MOS tubes M1 and M2 are interconnected and connected to the VA voltage output end, and drains of the MOS tubes M1 and M2 are interconnected and connected to a gate of the MOS tube M3, a drain of the MOS tube M3 is used as the VB voltage output end and is connected to one end of the resistor R4 and a gate of the MOS tube M4, the other end of the resistor R4 is connected to the VA voltage output end, and a drain of the MOS tube M4 is connected to its own source and the sources of the MOS tubes M1 and M2 and connected to the reference ground GND line. An input end of the controlled delay module inputs the voltage VA output from the power amplitude detecting and internal power supply module. The specific parameters of the voltage VA reflect whether an index range of the voltage amplitude of the external power supply of the motor drive system meets the design requirements of the motor drive system. According to the design specifications of the motor drive system, the voltage amplitude of the external power supply of the motor drive system must meet the minimum index requirements. At this time, the motor drive system is allowed to enter an initial working state from an off state, that is, whether the motor drive system is out of the off state can be managed through the control of the voltage VA. Specifically, a threshold amplifier is composed of the MOS tubes M1 and M2 in the controlled delay module to detect the specific parameters of voltage VA. The output end of the controlled delay module outputs the voltage VB jointly managed and controlled with the output end of the power supply judging and adjusting module. The specific parameters of the voltage VB reflect the requirements of whether a delay time length is completed. Specifically, the detection of the completion proportion of the delay time length is realized through a delay circuit composed of the MOS tubes M3, M4 and resistor R4 in the controlled delay module, and expressed as the specific voltage value of the above voltage VB.

The waveform shaping module described in the preferred embodiment includes MOS tubes M5, M6, M7 and M8. Gates of the MOS tubes M5 and M6 are interconnected and connected to the VB voltage output end, sources of the MOS tubes M5 and M7 are interconnected and connected to the VCC voltage output end, drains of the MOS tubes M5 and M6 are interconnected and connected to gates of the MOS tubes M7 and M8, the gates of the MOS tubes M7 and M8 are interconnected and drains of the MOS tubes M7 and M8 are interconnected to use as the VC voltage output end, and the sources of MOS tubes M6 and M7 are interconnected and connected to the reference ground GND line. An input end of the waveform shaping module inputs the voltage VB, and an output end of the waveform shaping module outputs the voltage VC. And after being processed by the waveform shaping module, the voltage VC will become a standard digital logic level and is applicable to the design of other modules of the motor drive system. Specifically, through a non-inverting amplifier composed of the MOS tubes M5, M6, M7 and M8, the above voltage VB is adjusted to the standard digital logic level and is suitable for the voltage VC designed by other modules of the motor drive system.

The power supply judging and adjusting module includes resistors R5 and R6, a unidirectional diode D2 and MOS tubes M9, M10 and M11, one end of the resistor R5 and the unidirectional diode D2 is connected to the VC voltage output end, the other end of the unidirectional diode D2 is connected to a source of the MOS tube M9, and a gate of the MOS tube M9 is connected to the VC voltage output end, a drain of the MOS tube M9 is respectively connected to one end of resistor R6 and a gate of the MOS tube M10, drains of the MOS tubes M10 and M11 are interconnected and connected to the other end of the resistor R5, the other end of the resistor R6 is connected to sources of the MOS tubes M10 and M11 and is connected to the reference ground GND line. The power supply judging and adjusting module comprehensively judges whether the input voltage VB is needed through the voltage VCC connected to the positive power supply end of the power supply judging and adjusting module and the specific parameters of the voltage VC. Specifically, the above judgment is realized by a voltage superposition value of a sum of an opening voltage value of the unidirectional diode D2 and an opening voltage value of the MOS tube M9 in the power supply judging and adjusting module. If the voltage superposition value is large enough, that is, the controller composed of the resistor R5, resistor R6 and MOS tube M10 can turn on the MOS tube M11 and control the above voltage VB. At this time, it indicates that the voltage VB is jointly managed and controlled by the controlled delay module and the power supply judging and adjusting module. If the voltage superposition value is small enough, that is, the controller composed of the resistor R5, resistor R6 and the MOS tube M10 cannot turn on the MOS tube M11, so the power supply judging and adjusting module will no longer participate in the control of the above voltage VB. At this time, the voltage VB reflecting whether the delay time length is completed will only be controlled by the controlled delay module.

The start-up initialization circuit described in the preferred embodiment is used to detect and manage the voltage change of each node of the drive system in real time, so that the motor drive system can realize the start-up initialization process transiting from the off state to the normal working state. The specific working mode and principle are as follows:

For any drive system, including motor drive systems, an external power supply is required to work. In order to ensure the overall performance of the motor drive system, the external power supply voltage of the motor drive system must meet the minimum voltage amplitude index. Under a normal condition, the external power supply voltage of the motor drive system must be higher than the minimum voltage amplitude index to allow the motor drive system to enter the normal working state, otherwise the motor drive system must be in the off state. Therefore, the power amplitude detecting and internal power supply module of the present disclosure detects the voltage amplitude of the external power supply of the motor drive system in real time and converts it into the voltage VA output by the other output end of the power amplitude detecting and internal power supply module. When the voltage value of the external power supply of the motor drive system is not higher than the minimum voltage amplitude index of the power supply required above, the voltage VA is a low voltage amplitude and indicates that the motor drive system is not allowed to enter the start-up initialization state at this time, and the motor drive system will remain the off state. When the voltage value of the external power supply of the motor drive system is higher than the minimum voltage amplitude index of the power supply required above, the voltage VA is a high voltage amplitude and indicates that the motor drive system is allowed to enter the start-up initialization state at this time.

In specific use, in order to reduce the power consumption of the motor drive system and improve the performance of the motor drive system, the power supply voltage amplitude of the unit modules in the motor drive system should not be too high, and the minimum voltage amplitude index of the unit modules in the motor drive system should be sufficient to meet the working requirements of the unit modules. The power supply of the unit modules in the motor drive system of the present disclosure comes from the internal power supply automatically constructed by the power amplitude detecting and internal power supply module. The amplitude of the internal power supply voltage is lower and controllable compared with the external power supply voltage of the motor drive system. The internal power supply voltage is specifically the voltage VCC output by one output end of the power amplitude detecting and internal power supply module.

Secondly, there must be a process of establishing the normal working voltage parameters of multiple nodes of the motor drive system started from scratch, especially the voltage parameters of the external power supply of the motor drive system and the voltage VCC parameters output by one of the output ends of the power amplitude detecting and internal power supply module, and the processes of the two started from scratch, from the initial zero state to stable establishment are independent of each other, and the time required to complete the establishment is also different. However, it must be ensured that the external power supply voltage indexes of the motor drive system and power supply voltage of the unit modules in the motor drive system can meet the expected requirements before the motor drive system can be transited from the off state to the normal working state. For the former, as mentioned above, the judgment has been completed through the voltage VA output by the other end of the power amplitude detecting and internal power supply module. For the latter, the judgment is completed through the synthesis of the voltage VCC parameters from one of the output ends of the power amplitude detecting and internal power supply module connected to the positive power supply end of the power supply judging and adjusting module and the voltage VC parameters with standard digital logic level attribute output from the output end of the waveform shaping module. When and only when the amplitude of voltage VCC is sufficient to meet the working requirements of the unit modules in the motor drive system and the voltage VC with standard digital logic level attribute is the low voltage amplitude, the power supply judging and adjusting module allows the controlled delay module to calculate the delay time length, and the delay time length shall be long enough. That is, it can cover the voltage parameters of the external power supply of the motor drive system or time requirement for the voltage VCC parameters output by one of the output ends of the power amplitude detecting and internal power supply module to be established from scratch and stabilized, otherwise the controlled delay module is not allowed to calculate the delay time length and keep the voltage VB as the low voltage amplitude.

Whether the delay time length calculation work performed by the controlled delay module of the present disclosure can be carried out, in addition to the management control of the power supply judging and adjusting module, the controlled delay module is also required to judge the voltage VA from the other output end of the power amplitude detecting and internal power supply module at its input end. When the voltage VA is a low voltage amplitude, which means that the motor drive system is not allowed to enter the start-up initialization state at this time, then the controlled delay module is not allowed to calculate the delay time length and keep the above voltage VB as a low voltage amplitude. When the voltage VA is a high voltage amplitude, which means that the motor drive system is allowed to enter the start-up initialization state at this time, then the controlled delay module is allowed to calculate the delay time length, and after the delay timing time is set, the output voltage VB at the output end of the controlled delay module changes from the low voltage amplitude to the high voltage amplitude.

At the same time, the voltage VB jointly managed and controlled by the output end of the controlled delay module and the output end of the power supply judging and adjusting module is input to the input end of the waveform shaping module, and output of the output end of the waveform shaping module is in phase with the voltage VB and has the standard digital logic level attribute, as described above, after the motor drive system allows the calculation of the delay time length and completes the setting of the delay time timing, the voltage VB changes from the low voltage amplitude to the high voltage amplitude, the voltage VC also changes from the low voltage amplitude to the high voltage amplitude, and the power supply judging and adjusting module is closed. So far, the start-up initialization process of the motor drive system transiting from the off state to the normal working state has been completed, which greatly ensures the power on and start-up reliability of the motor drive system and provides a guarantee for the stable and efficient operation of the motor drive system.

The above embodiments only describe the preferred embodiments of the present disclosure and do not limit the scope of the present disclosure. Without departing from the design spirit of the present disclosure, various modifications and improvements made by ordinary technicians in the art to the technical scheme of the present disclosure shall fall within the protection scope determined by the claims of the present disclosure.

What is claimed is:

1. A start-up initialization circuit of a motor drive system, comprising a power amplitude detecting and internal power supply module, a controlled delay module, a waveform shaping module and a power supply judging and adjusting module integrated on a same substrate, configured to detect and manage a voltage change of each node of the motor drive system in real time to cause the motor drive system to realize a start-up initialization process that transitions from an off state to a normal working state;

wherein a power supply positive end of the power amplitude detecting and internal power supply module is connected to an external power supply, and the power amplitude detecting and internal power supply module outputs a VCC voltage at a VCC voltage output end and a VA voltage at a VA voltage output end; a positive power supply end of the controlled delay module is connected to the VCC voltage output end, and an input end of the controlled delay module is connected to the VA voltage output end, wherein the controlled delay module outputs a VB voltage; a positive power supply end of the waveform shaping module is connected to the VCC voltage output end, and an input end of the waveform shaping module is connected to the VB voltage output end, wherein the waveform shaping module outputs a VC voltage; a power supply positive end of the power supply judging and adjusting module is connected to the VCC voltage output end, and an input end of the power supply judging and adjusting module is connected to the VC voltage output end, wherein the power supply judging and adjusting module outputs the VB voltage; negative power supply ends of the power amplitude detecting and internal power supply module, the controlled delay module, the waveform shaping module and the power supply judging and adjusting module are grounded.

2. The start-up initialization circuit of motor drive system according to claim 1, wherein the power amplitude detecting and internal power supply module comprises resistors R1, R2, R3 and a zener diode D1, one end of the resistors R1 and R3 is connected to the external power supply, wherein the other end of the resistor R1 is used as the VA voltage output end and connected to one end of the resistor R2, and the other end of the resistor R3 is used as the VCC voltage output end and connected to a negative pole of the zener diode D1, the other end of the resistor R2 is connected to a positive pole of the zener diode D1 and grounded.

3. The start-up initialization circuit of motor drive system according to claim 1, wherein the controlled delay module comprises a resistor R4 and MOS tubes M1, M2, M3 and M4, a source of the MOS tube M1 is connected to the VCC voltage output end, and gates of the MOS tubes M1 and M2 are interconnected and connected to the VA voltage output end, and drains of the MOS tube M1 and M2 are interconnected and connected to a gate of the MOS tube M3; a drain of the MOS tube M3 is used as the VB voltage output end and connected to one end of the resistor R4 and a gate of the MOS tube M4, the other end of the resistor R4 is connected to the VA voltage output end, and a drain of the MOS tube M4 is connected to a source of the MOS tube M4 and the sources of the MOS tubes M2 and M3, and grounded.

4. The start-up initialization circuit of motor drive system according to claim 1, wherein the waveform shaping module comprises MOS tubes M5, M6, M7 and M8, gates of the MOS tubes M5 and M6 are interconnected and connected to the VB voltage output end, sources of the MOS tubes M5 and M7 are interconnected and connected to the VCC voltage output end, drains of the MOS tubes M5 and M6 are interconnected and connected to gates of the MOS tubes M7 and M8, the gates of the MOS tubes M7 and M8 are interconnected and drains of the MOS tubes M7 and M8 are interconnected to use as the VC voltage output end, and the sources of the MOS tubes M6 and M8 are interconnected and grounded.

5. The start-up initialization circuit of motor drive system according to claim 1, the power supply judging and adjusting module comprises resistors R5 and R6, a unidirectional diode D2 and MOS tubes M9, M10 and M11, one end of the resistor R6 and one end of the unidirectional diode D2 are connected to the VCC voltage output end, the other end of the unidirectional diode D2 is connected to a source of the MOS tube M9, and a gate of the MOS tube M9 is connected to the VC voltage output end, a drain of the MOS tube M9 is respectively connected to one end of resistor R5 and a gate of the MOS tube M10, a drain of the MOS tube M10 and a gate of the MOS tube M11 are interconnected and connected to the other end of the resistor R6, the other end of the resistor R5 is connected to sources of the MOS tubes M10 and M11 and grounded.

* * * * *